United States Patent [19]

de Bergh

[11] Patent Number: 4,552,996
[45] Date of Patent: Nov. 12, 1985

[54] METHOD AND APPARATUS FOR EVALUATING NOISE LEVEL ON A TELEPHONE CHANNEL

[75] Inventor: Guy de Bergh, Chatou, France

[73] Assignee: Compagnie Industrielle des Telecommunications, Paris, France

[21] Appl. No.: 550,661

[22] Filed: Nov. 10, 1983

[30] Foreign Application Priority Data

Nov. 10, 1982 [FR] France .................. 82 18854

[51] Int. Cl.⁴ .............................. H04M 3/32
[52] U.S. Cl. ..................... 179/175.2 C; 381/46; 375/99
[58] Field of Search ............... 179/175.2 C, 170 E; 381/34, 35, 46; 370/17; 455/222, 223; 375/26, 99; 340/347 AD

[56] References Cited

U.S. PATENT DOCUMENTS

| | | | |
|---|---|---|---|
| 4,074,201 | 2/1978 | Lennon | 325/363 |
| 4,331,837 | 5/1982 | Soumagne | 381/46 |
| 4,351,983 | 9/1982 | Crouse et al. | 381/46 |
| 4,352,094 | 9/1982 | Reneric | 340/347 AD |
| 4,357,491 | 11/1982 | Daaboul et al. | 381/35 |

OTHER PUBLICATIONS

Comsat Technical Review, vol. 6, No. 1, 1976, Washington, D.C., J. A. Jankowski, Jr., "A New Digital Voice-Activated Switch", pp. 159-178.

Primary Examiner—Stafford D. Schreyer
Attorney, Agent, or Firm—Sughrue, Mion, Zinn, Macpeak & Seas

[57] ABSTRACT

The level of the signal present on the telephone channel is evaluated at successive time intervals. Those evaluated signal levels which lie within a given range of noise levels are selected and they are expressed in terms of r discrete values in said range. A count is maintained for each of said discrete values indicative of the frequency with which it is selected in comparison with the frequency with which the other discrete values are selected. The discrete value having the highest count, i.e. the most frequently selected discrete value, is considered to be indicative of the level of noise on the telephone channel in question.

15 Claims, 5 Drawing Figures

METHOD AND APPARATUS FOR EVALUATING NOISE LEVEL ON A TELEPHONE CHANNEL

The field of the present invention is telephone transmission, and the invention relates to evaluating noise level on a telephone channel. The invention relates more particularly to solving the problem of performing such an evaluation on the basis of the signals present on the channel while it is in service, i.e. from signals comprising speech signals (or signalling) on which noise is superposed, and separated by intervals of silence which are occupied by noise only.

BACKGROUND OF THE INVENTION

A particular application of the invention lies in detecting speech, for example in apparatus for concentrating telephone signals by speech interpolation, or for generating background noise intended to reduce subscriber awareness of interruptions in a telephone network where transmission paths between subscribers in communication with each other may be temporarily interrupted, e.g. for echo suppression or for concentrating channels.

Known devices for concentrating telephone signals by speech interpolation as applied to some multichannel telephone links serve to increase the capacity of said links by not transmitting the silences in conversations. These devices thus include speech detectors for identifying speech periods and periods of silence on each of the channels to be concentrated. The performance of such concentrator devices is directly related to the quality of speech/silence discrimination as performed by said speech detectors. In particular, it is desirable that these speech detectors should be most insensitive to noise in order to obtain a high concentration rate, while at the same time being highly sensitive to speech signals in order to avoid chopping speech.

One known method of detecting a speech signal on a telephone transmission channel consists essentially in monitoring the level of the signal on the channel in question. Thus, any signal on the monitored channel whose level over a given time interval is greater than a threshold set above the noise level on the channel, is assumed to be a speech signal, while everything else is assumed to be silence. In order to perform such speech-/signal detection on a channel, it is known to generate a signal which is representative of the average level of the signal present on the channel over a unit time interval and to compare said generated signal with an upper threshold level for noise on the channel. Another known way of performing such speech signal detection on a channel consists in sampling the channel at 8 kHz and in comparing the amplitude of each sample of the signal present on the monitored channel with an upper threshold for noise on the channel, and in giving each sample an algebraic "mark" which is a function of the comparison, and in accumulating the marks given to successive samples in order to discriminate between speech and silence on the basis of the accumulated "marks".

In order to determine the comparision threshold for use in such speech signal detection, the maximum noise level allowed by the CCITT for a telephone channel, i.e. −40 dBmo is sometimes taken as the reference noise level. However, the noise level on a telephone channel may be substantially different from this value, and better speech/silence discrimination may be obtained by evaluating the noise level on the channel being monitored and by varying the comparison threshold as a function of the evaluated noise level. Proposals for this technique are also known.

Evaluating the nose level on a telephone channel is also useful for generating background noise in some kinds of telephone network. Thus, when a telephone call uses a four-wire circuit fitted with echo suppressors, and when only one of the subscribers on the call is speaking, the telephone channel in the four-wire circuit for transmitting from the silent listening subscriber towards the speaking subscriber is interrupted in order to prevent echo signals from propagating.

Downstream from the interruption, background noise is injected into the interrupted channel in order to compensate for the background noise normally heard by the currently speaking subscriber and generated by the equipment in the network from which the currently speaking subscriber has been disconnected by the interruption. Evaluating the level of the genuine background noise and matching the level of the injected background noise thereto ensures that the noise level is properly compensated, and thereby substantially reduces the subscribers' perception of said interruptions, which perception interferes with smooth conversation.

The problem of reducing subscribers' perception of temporary interruptions in transmission channels during a call is also present in telephone networks which are equipped with speech interpolator concentration devices. In such devices, an evaluation of the noise level on a channel may be used both to detect speech and to generate background noise.

The essential problem to be solved when the noise level on a telephone channel is to be evaluated on the basis of the signals present on the channel while it is in service, is to avoid the speech signals conveyed by said channel, some of which may be at very low level, from interfering with the evaluation. One solution to this problem proposed in published French patent document No. 2 451 680 corresponding to U.S. Pat. No. 4,331,837, which describes a noise level evaluation circuit for use on a telephone channel integrated in a speech detector, is to use two average filters, a first one of which has a fairly narrow band while the second filter has a very narrow band. Both filters process the signal present on the channel being monitored during periods of silence as determined by the speech detector, the first filter also processes the signal present on the channel during periods of speech activity as detected by the speech detector, while the second filter is continuously initialised to twice the value of the output signal from the first filter. The noise level of the channel is evaluated as being equal to the last common convergence value of both filters. Such a method of proceeding is based on the fact that the background noise on a telephone channel is generally fairly constant, unlike speech signals which have a highly variable level. Under such conditions, the two filters only converge towards the same value when the background noise has been present on the channel on its own for a relatively long period of time, where the equivalent time constants of the filters are respectively approximately 8 ms and 0.128 ms. The resulting common convergence value is then representative of the average noise level.

Another solution for solving the same problem is also based on these different characteristics of speech signals and background noise on a telephone channel and is described in published French patent document No. 2

482 389. In this case, a circuit for calculating an average generates a representation of the average level of the signal present on the channel being monitored over a unit time interval. Two sample-and-hold circuits extract and retain the maximum and the minimum values respectively of said representation, said sample-and-hold circuits being re-initialised at the same rate which has a long period relative to said unit time interval. A comparator compares the minimum and maximum values provided by the two sample-and-hold circuits in order to detect moments when the two values satisfy a given relationship determining a small difference between the values. The nose level is then obtained from the minimum values of the representation for which said relationship is satisfied. To perform these operations, the equivalent time constant of the average calculating circuit is 16 ms and the two sample-and-hold circuits are re-initialised at a higher rate while the channel is assumed to be inactive than while it is assumed to be active, e.g. every 256 ms and every 2 s respectively, said assumed states of the channel corresponding to states of a sequential machine which is sequenced under the control of parameters which are a function of the representation of the average signal level present on the channel, with the evaluated noise level playing its part in determining said parameters.

With both of these solutions, the noise level is evaluated only during intervals of silence which are fairly long. This can lead to excessive acquisition times, particularly in the case where the signals on a channel include not only speech signals from the subscriber transmitted over the channel, but also echoes signals of the speech signals from the other subscriber. In such a case, the noise level will only be evaluated when both subscribers stop talking simultaneously for a considerable length of time. Further, both of the above solutions require periods of speech and periods of silence to be recognised which means that complicated equipment is necessary and may be excessive in contexts where speech detection per se is not called for.

Preferred embodiments of the present invention remedy these drawbacks and enable the noise level on a telephone channel to be evaluated rapidly and accurately by means of simple equipment.

SUMMARY OF THE INVENTION

The present invention provides a method of evaluating the noise level on a telephone channel on the basis of the signal present on the channel during successive time intervals of substantially equal duration, the method comprising the steps of:

assigning the noise level on said channel to a given "noise level" range made up of a limited defined set of discrete level values;

observing successive signal level values present on the channel and selecting those observed values which lie in said noise level range; and keeping records of the different selected signal level values expressed in terms of said discrete values to take as being representative of the noise level on the channel that one of the discrete values on which the majority of the selected noise level values are concentrated.

Advantageously, each selected value is weighted in the keeping of said records by a factor which is larger or smaller depending on whether the selected value is equal to the current evaluated noise level value or not.

The present invention also provides apparatus for performing the above method. The apparatus comprises:

an evaluator circuit for evaluating the level of the signal present on the telephone channel during successive time intervals I of substantially equal duration;

a selector circuit connected to receive successive evaluated signal levels from the evaluator circuit and for selecting only those evaluated level which lie within a given "noise level" range of values assigned to noise, said selected values being delivered expressed in terms of a limited defined set of r discrete level values;

an analyzer circuit connected to receive said selected values as delivered by said selector circuit, said analyzer circuit being sensitive to the distribution of said selected values amongst said discrete values for determining that one of the discrete values on which the majority of the selected values are concentrated and for delivering said determined value at an output to represent the noise level; and a clock circuit for driving said evaluator circuit, said selector circuit, and said analyser circuit to determine the noise level once every time interval I as determined by said clock circuit.

In a particular embodiment of the invention, the analyser circuit comprises:

an addressable memory addressed under the control of a sequence signal generated by said clock circuit, said memory storing r counts each corresponding to a respective one of said r discrete values and together being representative of the distribution of said selected values amongst the r possible discrete values;

a count computing circuit comprising firstly a count increment defining circuit for defining a count increment and secondly a two-input summing circuit having one input connected to an output from said memory, having the other input connected to an output from said count increment defining circuit, and having an output connected to an input to said memory;

a control circuit including comparator means, said control circuit being arranged, on arrival of each selected value as delivered by the selector circuit, firstly to compare each particular selected value with r possible discrete values to identify the corresponding memory address, secondly to compare each of the memorised counts with a predetermined lower threshold value and a predetermined upper threshold value, and thirdly to control said count increment defining circuit to choose a positive increment value for the selected discrete value only whenever the count corresponding to the selected discrete value does not exceed said upper threshold value, and to choose a negative increment value for all the other counts greater than said lower threshold value whenever the count corresponding to the selected discrete value exceeds said upper threshold; and a noise level value output circuit controlled by said control circuit when a memorised count exceeds said upper threshold value to output the discrete value corresponding to said count.

BRIEF DESCRIPTION OF THE DRAWINGS

An embodiment of the invention is described by way of example with reference to the accompanying drawings, in which.

DETAILED DESCRIPTION OF THE INVENTION

The noise level evaluating circuit shown in the figures is a digital type circuit. It is provided to process a signal on a telephone channel when the signal is available in the form of successive digital samples. To simplify the description, the circuit described processes only one telephone channel. It could naturally be adapted to process a plurality of telephone channels in time sharing mode.

Likewise, to simplify the description, links which convey digital signals defined by binary words comprising a plurality of bits in parallel have been drawn as a single heavy line rather than as a multiplicity of light lines. Links which are drawn as light lines convey binary signals. The number of bits conveyed in parallel by the heavy lines is explained in detail when the corresponding figures are being described.

Figure 1:
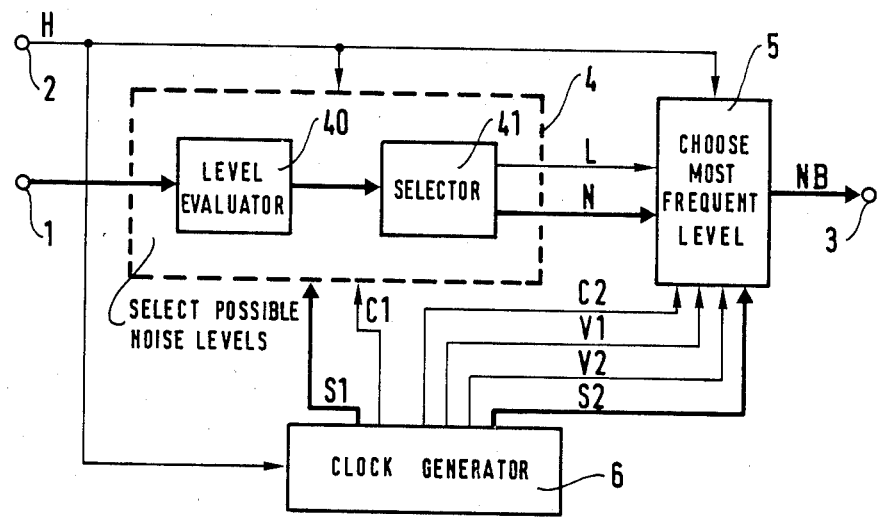
FIG. 1 is a block diagram of a noise level evaluating circuit in accordance with the invention.

The circuit in accordance with the invention shown in FIG. 1 has an input 1 connected to receive in parallel bits which define the amplitude of digital samples of the signal present on a telephone channel being processed and independently of the polarity of said samples. It also has an input 2 on which it receives a clock signal H at the sampling frequency, and an output 3 on which the evaluated noise value, NB, is made available likewise in digital form. A circuit 4 is connected to both of the inputs and serves to evaluate and to select the level values of the signal present on the channel. A circuit 5 for analysing the selected values as delivered by the circuit 4 is connected downstream from the circuit 4 and is also connected to the input 2 to receive the clock signal H. The output from the circuit 5 provides the evaluated noise level value NB on the output 3 from the circuit as a whole. A clock circuit 6 receives the clock signal H from the input 2 and generates therefrom various timing signals which are explained below and which are required for operation of the circuits 4 and 5.

The circuit 4 evaluates the level of the signal present on the telephone channel over successive time intervals I of equal duration. Said time interval is long relative to the period of the clock signal H which is at the sampling frequency. The circuit 4 selects those signal level values which fall within a given range of values P considered to be a range of possible noise level values and referred to as the noise level range. A first output from the circuit 4 provides a logic signal L which indicates for each signal level value whether or not said value falls within the range P. A second output provides the actual signal level values when a fall within said range P, said values are designated by N and are expressed in terms of a limited set of r different possible values designated $N_0$ to $N_{r-1}$. To do this, the circuit 4 comprises a level evaluator circuit 40 which receives the bits of the samples as applied to the input 1, i.e. the samples of the signal present on the telephone channel, and a selector circuit 41 which receives the level values generated by the circuit 40 and which selects those values which fall within the range P. The circuit 40 evaluates the level of the signal on the channel when it falls within the range P, using more than r different possible values. The selector circuit 41 thus also serves to transcode the values which it selects so that they are expressed in terms of the r possible discrete values $N_0$ to $N_{r-1}$.

The circuit receives a clock signal C1 from the clock circuit 6 to define the intervals I, and a sequencing signal S1 which defines identical sequences s1 each of which take place over an interval I to define different operational phases of the circuit 4 therein. These phases are described below during the detailed description of FIG. 2.

The time intervals I over which the level of the signal present on a telephone channel is evaluated have a duration which is chosen to be long relative to the bottom frequency of the passband. In other words a period which is long relative to 1/300 seconds ≃3.3 ms. The period of the interval I is also chosen to be short relative to the average time for the level to increase or decrease at the beginning or at the end of a syllable. This time is about 40 ms.

The circuit 5 analyses the selected values N which it receives from the circuit 5 and is sensitive to their distribution among the r possible different values $N_0$ to $N_{r-1}$. Generally speaking, the majority of these selected values N is concentrated on a single one of the values $N_0$ to $N_{r-1}$, and it is the value on which they are concentrated that is detected by the circuit 5 and which is then considered as being representative of the noise level on the channel. Thus, when the signal present on the telephone channel is only background noise, the circuit 4 evaluates the level of this background noise signal by providing successive level values which fall within the range P and which are thus selected. It turns out that there is little dispersion in these selected values (because of the "quasi stationary" character of background noise), and in general the selected values are mainly concentrated on a single one of the values $N_0$ to $N_{r-1}$ with secondary concentrations on the two adjacent values, or on the single adjacent value if there is only one. However, when a speech signal is superposed on the noise, the values of the signal level on the telephone channel either fall outside the range of levels P and are thus ignored by the circuit 5 or else they fall within the range P but turn out to be highly dispersed (because of the "non-stationary" character of speech signals). Such signals do not manage to overturn a previously established majority representative of background noise level. A telephone channel also spends at least some of its time conveying signalling. Signalling makes use of very high level signals and it is therefore unlikely to have a significant effect on the distribution calculations performed by the circuit 5.

The circuit 5 keeps records concerning the selected values N which are expressed by the different values $N_0$ to $N_{r-1}$. Essentially, it maintains r tallies or counts of the number of occasions on which each of the r possible discrete noise level values $N_0$ to $N_{r-1}$ is selected; and each time a new value N is selected, the circuit 5 updates its counts relative to one another. To perform this relative updating, the circuit 5 takes into consideration the position of the count already reached for the newly selected value N and compares it with an upper fixed threshold which is the same for all of the counts. Also, when applicable, it takes into consideration the positions of all the other counts relative to a fixed lower threshold which is the same for all of them. If the count corresponding to the currently selected value is less than the upper threshold, the circuit 5 increases the count in question by a certain quantity and the other counts are left unchanged. However, if the count relating to the currently selected value has already exceeded said upper threshold, this count is left unchanged while all the other counts which are above the lower threshold are reduced by a certain quantity.

Generally speaking, only one of the r counts maintained by the circuit 5 exceeds the given upper threshold, and the corresponding signal level value is taken to be the value of the nose level as evaluated and delivered by the circuit 5. However, it may sometimes happen, particularly immediately following a change in noise level, that the upper threshold is exceeded by more than one count. In such a case, the circuit 5 selects one of the corresponding values of signal levels, for example it may select the higher of the two noise values for forwarding as the evaluated noise level at the output from the circuit as a whole.

The circuit 5 receives a sequence signal S2 from the clock circuit 6 to determine within each time interval I a plurality of identical sequences s2, each having r periods of the clock signal H for executing (in series and during each interval I) operations concerning the r values $N_0$ to $N_{r-1}$. It also receives from the same clock circuit, two signals V1 and V2 having periods of equal duration to the intervals I. The signals V1 and V2 are of the same form and each of them marks within each interval I a corresponding one of the sequences s2 during which the circuit 5 performs all the processing to be performed within said interval. Further, it receives a signal C2 from the clock circuit 6 having the same form as the signal C1 but delayed relative thereto in order to take account of processing time.

The various circuits and signals appearing in FIG. 1 are described in more detail below. In the following description the bistables, registers and counters included in the circuits are considered to be sensitive to the rising fronts of the signals applied to their clock inputs, and the bistables and registers are assumed to take into account the logic levels which were present at their inputs just before the appearance of said rising fronts when the fronts appear. Furthermore, it has been assumed that the samples of the signal on the telephone channel are changed on the rising fronts of the clock signal H.

By way of specific example, throughout the following description the value r is chosen to be equal to 16 and the 16 values $N_0$ to $N_{15}$ are regularly spaced in terms of dB over a noise level range extending substantially from −55 dBmo to −35 dBmo. The time intervals I are chosen to have a duration equal to 16 ms. The signal on the telephone channel sampled at a rate of 8 kHz is assumed be PCM encoded on 8 bits, comprising 7 amplitude bits and an 8th sign bit. For example, the A=87.6 compression law may be used, in which case the 32 smallest levels out of the 128 encodable levels on the 7 bits correspond to the range of amplitude values less than −33 dBmo. It should nevertheless be understood that the level evaluating circuit 40 may be adapted to some other law, for example the $\mu$=255 law.

Figure 2:
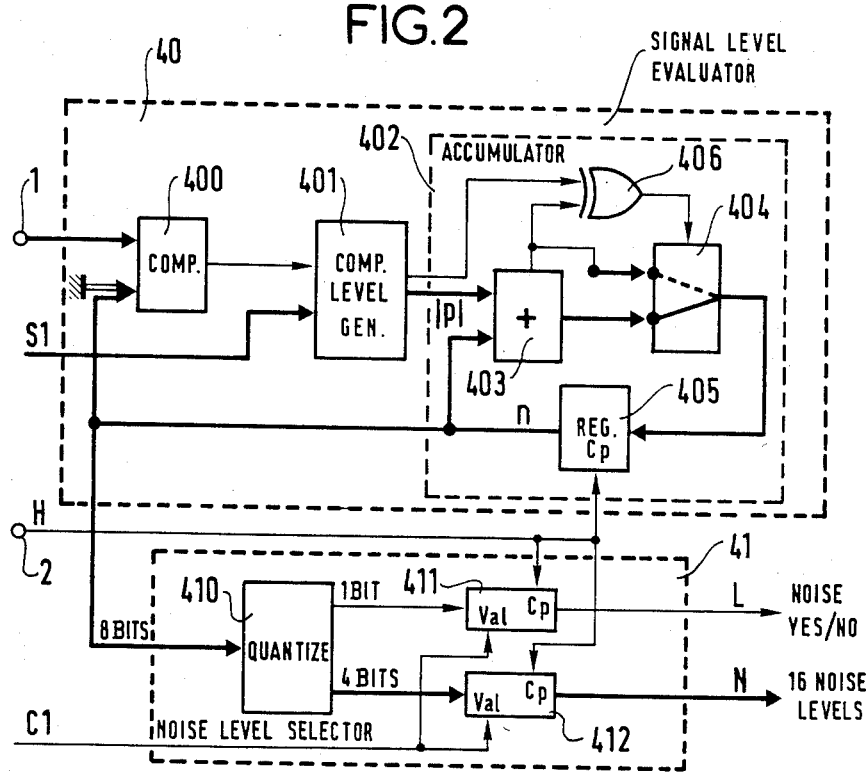
FIG. 2 is a circuit diagram of an evaluator circuit and a selector circuit used in the FIG. 1 circuit.

FIG. 2 is a more detailed circuit diagram of the level evaluator circuit 40 and of the selector circuit 41 which together constitute the circuit 4 of FIG. 1.

The level evaluator circuit 40 is constituted by a servo loop comprising a comparator 400, a circuit 401 for defining the variation of the value n of a comparison level to be applied to the comparator 400, and an accumulator 402 for accumulating the variation steps p defined by the circuit 401.

The comparator 400 has a first input which constitutes the input to the circuit 40 which is connected to the input 1 to the circuit as a whole. On this input it receives the 7 bit value ($2^0$ to $2^6$) representative of the amplitude of successive samples of the signal present on the telephone channel. It also has a second input on which it receives the value of the variable comparison level n which is to be applied on the output from the circuit 40. In response to these two input signals, it delivers a logical output signal whose level "1" or "0" indicates whether or not the value of the current sample of the signal present on the telephone line is greater than the value of the comparison level n.

The circuit 401 for defining the variation in the value of the comparison level n is connected to the output of the comparator 400. In addition to the logical signal supplied by the comparator, it receives the sequence signal S1 for defining the variation step p of the comparison value n which step is positive or negative depending on whether the logical signal at the output from the comparator is at level "1" or "0", and whose absolute value is determined by the signal S1. The absolute value decreases during each interval I as the sequence s1 proceeds.

By way of example, the following Table I provides a variation law for the absolute value of the variation step p, which absolute value is expressed digitally and goes from 2 (i.e. $2^1$) to $\frac{1}{8}$ (i.e. $2^{-3}$) during each interval I which is sub-divided into 8 sub-intervals of 2 ms duration numbered 0 to 7 by the sequence s1 as it takes place.

TABLE I

| Sub-interval in I | 0 | 1 | 2 | 3 | 4 | 5 | 6 | 7 |
|---|---|---|---|---|---|---|---|---|
| Absolute value of p | 2 | 1 | $\frac{1}{2}$ | $\frac{1}{2}$ | $\frac{1}{4}$ | $\frac{1}{4}$ | $\frac{1}{8}$ | $\frac{1}{8}$ |

The circuit 401, which may be constituted by a PROM (Programmable Read Only Memory) defines the variation step p using 9 bits, one of which is a sign bit having the value 1 for a positive sign and the value 0 for a negative sign, and the other 8 of which serve to express the absolute value and have respective weights of $2^{-3}$ to $2^4$, in which the absolute value of negative steps are expressed by their $2^5$ complement, thereby enabling subtractions to be replaced by additions in the calculations to be performed in the well-known manner.

The accumulator 402 is connected to the output of the circuit 401 and also receives the clock signal H. It accumulates the variation step p defined by the circuit 401 at the sampling frequency and between a lower stop and an upper stop. It delivers the level value n provided at the output of the level evaluating circuit 40 and as applied to the second input of the comparator.

The capacity of the accumulator 402 is limited to 8 bits having respective weights of $2^{-3}$ to $2^4$. The contents of the accumulator thus ranges between 0 and $31+\frac{7}{8}$ths, which represents a range of levels that includes the range P of noise levels and which extends beyond said range at both ends thereof.

In practice, on the eight bits contained in the accumulator, only the five most significant bits are applied to the second input to the comparator 400 which also receives two 0 bits permanently connected to the two terminals for receiving the $2^5$ and $2^6$ bits of said second input.

The accumulator 402 may be implemented, as shown, by means of an adder 403 having two eight-bit inputs, a multiplexer 404 having two multiplexing inputs which are likewise eight bits wide, a register 405 containing eight bits in parallel, and a two input exclusive OR logic gate.

The adder 403 has one of its inputs connected to receive the eight bits representative of the absolute value |p| of the successive steps delivered by the circuit 401, and the other input to the adder 403 receives the eight bits stored in the register 405 which defines the contents of the accumulator 402. The eight-bit sum delivered by the adder 403 is applied to a first input of the multiplexer 404. The second input of the multiplexer has its eight terminals connected in common as is symbolised in FIG. 2 by a light line expanding to a heavy line, and it receives thereon the carry bit from the adder 403. The second input thus receives the digital value 0 to $31+\frac{7}{8}$ths depending on the logical level of the carry, with "0" indicating no carry and "1" indicating a carry. The multiplexer 404 also receives the output signal from the exclusive OR gate 406 on its control input. The exclusive OR gate has one of its inputs connected to receive the bit present on the carry output from the adder 403, and has its other input connected to receive the sign bit of the step delivered by the circuit 401, and the "1" or "0" level of its output signal serves to control the selection of the first or the second input to the multiplexer 404. The output from the multiplexer is connected to a "data" input of the register 405 which also receives the clock signal H on its clock input Cp. The output from the register 405 constitutes the output from the accumulator and delivers the value of the comparison level n.

In operation of the accumulator, and provided during a given period of a clock signal H the algebraic sum of the contents of the accumulator and of the digital value of the step p is not negative and does not exceed $31+\frac{7}{8}$ths, the sum is applied to the first input of the multiplexer and is thence written into the register 405 at the beginning of the following period of the clock signal H. In other words, in this case the level at the carry output from the adder 403 is "0" and the sign bit of the step p is equal to "1", or vice versa; the signal at the output of the exclusive OR gate 406 is thus "1" and the first input of the multiplexer 404 is thus selected.

However, when for a given period of the clock signal H the algebraic sum of the contents of the accumulator and the value of the step p exceeds $31+\frac{7}{8}$ths, which gives rise to a carry output of value "1" with a step sign bit also equal to "1" the output signal from the gate 406 switches to level "0" thereby selecting the second input to the multiplexer. The second input is connected to receive the digital value $31+\frac{7}{8}$ths and thus this value is written into the register 405 at the beginning of the following period in the clock signal H.

In the third possible case, for a given period of the clock signal H, the algebraic sum of the contents of the accumulator and the digital value of the step p is negative which means that the output level on the carry from the adder is "0" and that the sign bit of the step is likewise "0", thereby causing the output signal from the exclusive OR gate 406 to be "0" and thus selecting the second input to the multiplexer which is then at value "0", and hence the eight-bit value 0 is written into the register 405 at the beginning of the following clock period H.

The level n which is digitally defined by the contents of the accumulator 402 thus varies at the sampling frequency with positive or negative steps depending on whether its value is greater than or less than the value of the amplitude of successive samples of the signal present on the telephone channel. The absolute values of the steps depend only on the numbers of the sampling periods concerned within the successive intervals I and decrease throughout each interval. Ignoring the peak limiting introduced by the limited capacity of the accumulator 402, this variable level n will converge under these conditions at the end of each interval I substantially to the median value, i.e. the value such that over the interval there are as many samples of the signal present on the channel having an amplitude greater than the level n as there are samples of lesser amplitude. The level of the signal present on the telephone channel is thus evaluated at the end of each interval I, and ignoring the effects of limiting, substantially to a median value. The limiting is not a handicap in what follows, since the only level values of interest are situated in the range of noise levels P.

Such a manner of evaluating the level of a signal present on a telephone channel is particularly suited to an application for detecting speech by proceeding, as explained in the introduction, by assigning "marks" to each sample of the signal to be analysed as a function of the results of a comparison between said sample and an upper noise level threshold, providing only the sign of the result is used. However, in a variant, the level of the signal present on the telephone channel over each interval I could be evaluated alternatively as being equal to the average value of the amplitude of the signal or as being equal to the root mean square value of the amplitude of the signal. This can be done by causing the absolute value of the variation step of the level value delivered by the servo loop to vary proportionally to the absolute value thereof or to the square of the difference between said level value and the amplitude of the signal sample present. Optionally, a proportionality factor may be introduced which decreases within each interval I.

The output of the level evaluator circuit 40 is connected to the input of a threshold transcoding circuit 410 in the selection circuit 41. The transcoding circuit serves both to select those level values n which are situated in the range of noise levels P, and also to perform transcoding between the linear eight-bit input code and a logarithmic four-bit output code for designating the selected values in such a manner as to express them in terms of the values $N_0$ to $N_{15}$ which may be encoded as 0 to 15 in order of increasing value, for example. It has a first output on which it delivers a logical signal whose level "1" or "0" indicates whether the value of the level n present at its input lies within the range P, and on a second output it delivers the four-bit transcoded value corresponding to the input value whenever the input value lies within the range P. The value delivered by the second output in the opposite case is of no significance since it is not taken into account by the analyser circuit 5.

The threshold transcoding circuit 410 may be constituted, for example, by means of a PROM.

A D type bistable 411 is connected to the first output from the threshold circuit 410, and a four-bit parallel register 412 is connected to the second output of said circuit. The bistable 411 and the register 412 are driven by the clock signal H which is applied to their clock inputs Cp and enabled by the signal C1 applied to their clock enable inputs Val. The signal C1 is at level "1" during the first period of the clock signal H in the first time sub-interval as defined by each sequence s1, i.e. during the first period of the clock signal H during each interval I, and it is at level "0" for the rest of the time. Thus, the output of the bistable 411 which constitutes the first output from the circuit 4 provides the logical signal L, while the output from the register 412 which constitutes the second output from the circuit 4 provides the selected values N with the presence of a selected value at the output of the register 412 being indicated by the signal L being at level "1".

Figure 3:
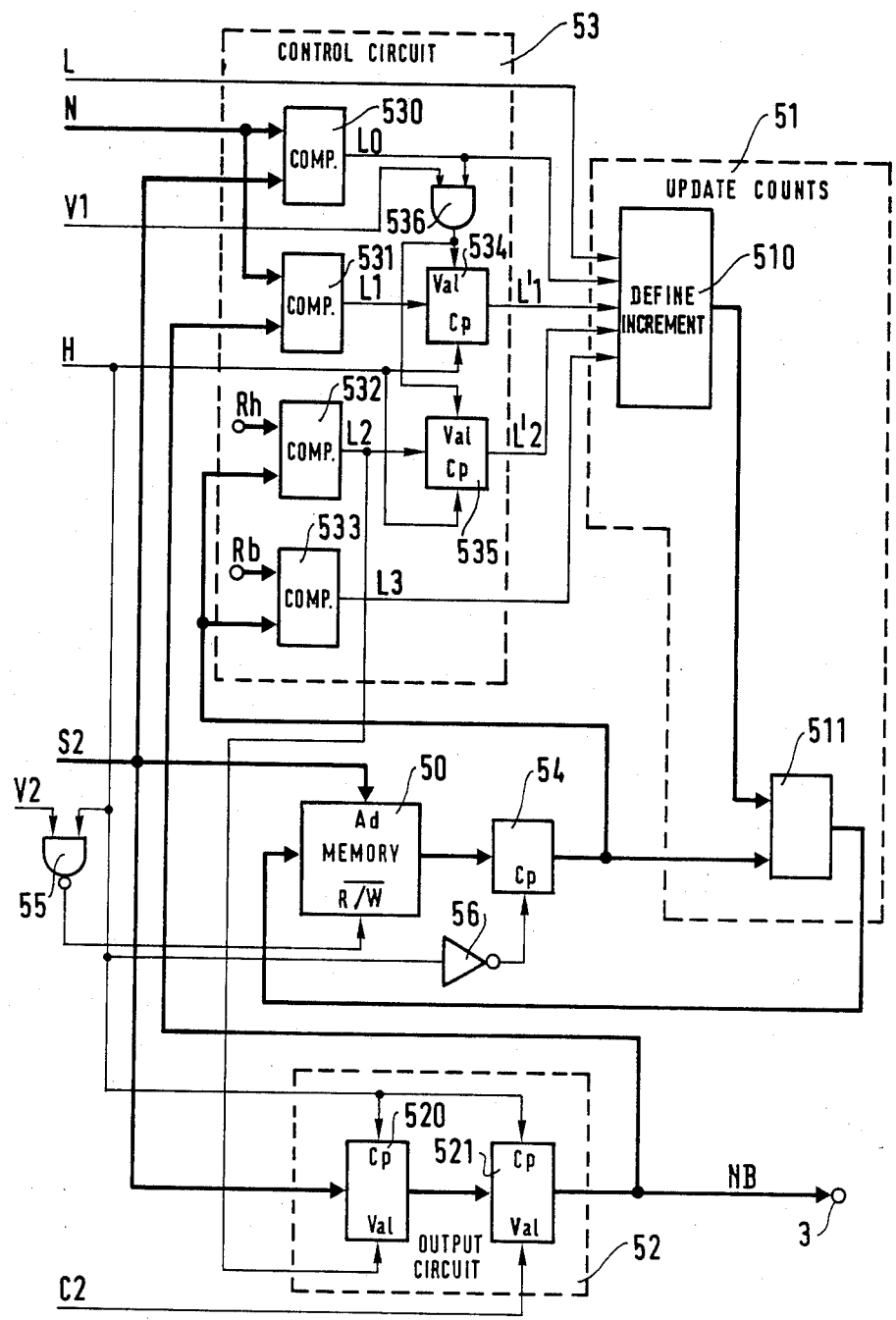
FIG. 3 is a circuit diagram of an analyser circuit used in the FIG. 1 circuit.

FIG. 3 is a more detailed circuit diagram of the circuit 5 for analysing the selected values N which it receives from the circuit 4 of FIG. 1.

The analyser circuit 5 is principally constituted by an addressable memory 50 in which it stores counts relating to the respective values $N_0$ to $N_{15}$; a calculator circuit 51 for calculating each of said counts; an output circuit 52 whose output constitutes the output 3 from the circuit as a whole on which the evaluated noise level NP is provided in digital form; and a control circuit 53 for controlling the circuit 51 for calculating the counts and for controlling the output circuit 52.

The memory 50 has a data input connected to the output of the circuit 51 for calculating the respective counts. It has a read and write control input $\overline{R}/$ connected to the output of a logical NAND gate 55 which has one input connected to receive the clock signal H and its other input connected to receive the signal V2. A level "1" output from the NAND gate 55 causes the memory 50 to read while a level "0" therefrom causes a write operation into the memory to be prepared. The write operation will subsequently be performed on the next following transition of the output from the NAND gate 55 from level "0" to level "1". The memory 50 also has an addressing input Ad to which the sequence signal S2 defining the sequences s2 is applied. Each of the sequences s2 runs for 16 periods of the clock signal H and is constituted by a sequence of numbers going from 0 to 15, i.e. it runs through all the code values assigned to the levels $N_0$ to $N_{15}$ at the sampling rate. During each interval I, the first sequence s2 which takes place therein begins on the second sampling period. The signal V2 is at level "1" while the second sequence s2 during each interval I is taking place and it is at level "0" for the rest of the time. The operations of writing into the memory 50 which correspond to updating the counts, are thus performed for each interval I during the second sequence s2. For the rest of the time the memory 50 remains continuously in read mode.

The control circuit 53 is connected to the outputs of the circuit 4 (see FIGS. 1 and 2) to receive the logical signal L and the selected values N. It is also connected to the output from the circuit 52 (i.e. to the output from the circuit as a whole) to receive the value of the evaluated noise level NB. Furthermore, it is connected to the output from the memory 50 via a register 54 clocked by the clock signal H after inversion in an inverter 56, whence it receives the stored counts. Finally, it receives the clock signal H, the sequence signal S2 and the signal V1 which is at level "1" throughout the first sequence s2 in each interval I and at level "0" during the rest of the time.

The control circuit 53 is mainly constituted by four comparators 530 to 533 and two D type bistables 534 and 535.

Each of the comparators 530 and 531 has a first input connected to the second output from the circuit 4 to receive the selected values N. The second input of the comparator 530 is connected to receive the sequence signal S2, while the second input of the comparator 531 is connected to receive the code representative of the evaluated noise level NB. The outputs from the comparators 530 and 531 deliver respective logical signals L0 and L1. These signals are at level "1" if the inputs to the corresponding comparator are equal and they are at level "0" otherwise. The comparators 532 and 533 are threshold comparators and each of them has one input connected to the register 54 to receive the stored counts from the memory 50. The comparator 532 has its other input connected to a fixed upper threshold which is applied to all of the counts, while the other comparator 533 has its other input connected to receive the fixed lower threshold which is applied to all of counts. These upper and lower thresholds mentioned above during the description of FIG. 1 are designated Rh and Rp. They are to be close to the upper and lower limits respectively between which it is decided to maintain the counts. They are used to keep the counts within said limits. The comparators 532 and 533 deliver respective logical output signals L2 and L3 on which a level "1" indicates that the received stored count has exceeded its threshold.

The two D type bistables 534 and 535 have their D inputs connected to the outputs from the comparators 531 and 532 respectively. The bistables are clocked by the clock signal H as enabled by a logic AND gate 536. The output signal from the AND gate is applied to the clock enable input Val of each of said bistables while the clock signal H is applied to their clock inputs Cp. The AND gate 536 has one input connected to the output from the comparator 530 and has its other input connected to receive the signal V1. Its output signal thus enables the clock signal H during the first sequence s2 of each interval I while the memory 50 is delivering the count corresponding to that one of the values $N_0$ to $N_{15}$ whose code is being delivered by the circuit 4 and applied to the first inputs of the comparators 530 and 531. The output signals L0 and L3 from the comparators 530 and 533, and the output signals L'1 and L'2 from the bistables 534 and 535 together with the logical signal L provided by the circuit 4 as repeated unchanged by the control circuit 53 are applied to the circuit 51 for calculating the counts. The calculator circuit 51 comprises a count increment defining circuit 510 which receives said five signals L, L0, L'1, L'2, and L3 together with a summing circuit 511 which is connected to the output of the circuit 510. The circuit 510 for defining the count increments responds to its five input signals by delivering a count increment value which is positive, negative or zero and defined according to a given law. This increment value is applied to one of the inputs of the summing circuit 511. The other input of the summing circuit 511 is connected via the register 54 to the output from the memory 50, and the output from the summing circuit constitutes the output of the calculator circuit 51 and is connected to the inputs to the memory 50.

The output circuit 52 has two registers 520 and 521. The register 520 receives the sequence signal S2 to enable it to store the code defined by said signal S2 when the count corresponding to the coded values $N_0$ to $N_{15}$ exceeds said upper threshold. The register 521 is connected downstream from register 520. Both of these registers 520 and 521 are driven by the clock signal H as applied to their clock inputs Cp. The clock signal H is enabled for the register 520 by the output signal L2 from the comparator 532 as applied to its clock enable input Val. Similarly, the clock signal H is enabled for the register 521 by the signal C2 applied to its clock enable input Val. Over each interval I, the signal C2 is at level "1" during the sampling period in which the second sequence s2 begins, i.e. during the eighteenth sampling period of the interval, and it is at level "0" the rest of the time. The code present in the register 520 at the end of said eighteenth sampling period is thus transferred to the register 521 which applies it to the output 3 from the circuit as a whole.

The following Table II gives the different count increment values as defined by the circuit 510 in response to the five logical input signals thereto. The non-zero values which are given by way of example correspond to a ceiling of about 255 for the counts which are expressed as eight-bit numbers.

TABLE II

| L'2 | L'1 | L<br>L0<br>L3 | 0<br>0 or 1<br>0 or 1 | 1<br>0<br>0 | 1<br>0<br>1 | 1<br>1<br>0 or 1 |
|---|---|---|---|---|---|---|
| 0 | 0 | | 0 | 0 | 0 | 4 |
| 1 | 0 | | 0 | 0 | −4 | 0 |
| 0 | 1 | | 0 | 0 | 0 | 5 |
| 1 | 1 | | 0 | 0 | −5 | 0 |

The count increment defining circuit 510 is constituted, for example, by a PROM which gives the given increment values expressed on eight bits using $2^8$ complement for negative values. The summing circuit 511 is then constituted by a simple adder having two eight-bit inputs and one eight-bit output. The thresholds Rh and Rb of the comparators 532 and 533 are chosen for example to be equal to 247 and 7 respectively, in which case each comparator can be a simple five-input logic AND gate and a simple five-input logic OR gate respectively, each of which receives the five most significant bits of the stored counts.

In operation, by virtue of the signal V2 applied to the NAND gate 55, the memory 50 alternates between writing and reading only during the second sequence s2 which takes place at the sampling frequency during each interval I. The memory is in read mode only during the other sequences s2 which also takes place at the sampling frequency during each interval I.

Further, during the first sequence s2 of each interval I, when the same code appears in said sequence as the code corresponding to the value supplied by the circuit 4 in conjunction with the beginning of a period of the signal H, the output signal L0 from the comparator 530 changes to level "1". Since the signal V1 is at level "1" during said first sequence s2, the output signal from the AND gate 536 enables the clock signal H as applied to the bistables 534 and 535. Under these conditions, both of these bistables sample the output signals L1 and L2 from the comparators 531 and 532 respectively at the end of the corresponding period in the clock signal H, i.e. just before the output signal from the gate 536 returns to level "0" at the beginning of the following period of the clock signal. Thus, the bistable 534 stores data indicating whether the value supplied by the circuit 4 is equal to the current evaluated noise value NB, said evaluating noise value being unchanged during the first sequence s2 since the signal C2 remains at level "0" throughout said sequence. Likewise, the bistable 535 stores data indicating whether the count of the relevant values $N_0$ to $N_{15}$ corresponding to the coded value supplied by the circuit 4 exceeds the upper threshold Rh.

Furthermore, when one of the counts delivered by the memory 50 is greater than the upper threshold Rh of the comparator 532, the signal L2 at the output from said comparator changes to level "1" and enables the clock signal H as applied to the register 520. The register 520 then samples the sequence signal S2 at the end of the period of the signal H during which said count is delivered by the memory 50, thus storing the code of that one of the values $N_0$ to $N_{15}$ which is concerned.

After the first sequence s2 has taken place, the register 520 thus contains either the sole code chosen from the values $N_0$ to $N_{15}$ for which the count exceeds the upper threshold Rh (the more usual case), or else (the occasional case) the code of the greater value $N_0$ to $N_{15}$ for which the counts exceed the upper threshold. Another exception concerns the first few intervals I when the apparatus is turned on, in which case the register may contain a code having a special value which an initialisation command (not shown) writes therein at the same moment as all the counts in the memory 50 are reset to zero.

During the second sequence s2 which takes place during each time interval I, the memory 50 is alternately in read mode and in write mode, changing mode at the level transitions of the clock signal H. It delivers in succession the stored counts relating to the values $N_0$ to $N_{15}$ respectively, and it delivers each of these counts during the first half of a period of the clock signal H, i.e. when said signal is at level "1". At the end of the first half of each period in this clock signal H, the count delivered by the memory 50 is sampled by the register 54 which then applies the sample to the comparators 532 and 533 in the control circuit 53 and to the summing circuit 511 of the count calculating circuit 51, and this value is applied up to the end of the first half of the following period of the clock signal H. Since the signal V1 is at level "0" during the second sequence s2, the output signals L'1 and L'2 from the bistables 534 and 535 remain unchanged at the value they had at the end of the first sequence s2 of the same time interval I, i.e. at the end of the sequence just before the second sequence s2 under consideration. During the greater part of the second half of each j-th ($1 \leq j \leq 16$) period of the clock signal H counting from the beginning of said second sequence and up to the end of the j-th period during which the sequence signal S1 has the code value j−1, the signals applied by the control circuit 53 to the increment defining circuit 510 indicate:

(1) by the level "1" or "0" of the signal L which does not change throughout this sequence whether or not the value of the level delivered by the circuit 4 is a selected value;

(2) by the level "1" or "0" of the signal L0 which varies at the beginning of each clock period H whether or not the code j-1 is the code which matches the value of the level delivered by the circuit 4;

(3) by the level "1" or "0" of L'1 whether the value delivered by the circuit 4 is equal or not to the evaluated noise level value NB present at the output from the circuit as a whole during the first sequence s2 of the same time interval I (said signal L′1 being defined during the first sequence s2 and remaining unchanged throughout the second sequence s2);

(4) by the level "1" or "0" of L′2 whether or not the count concerning the value $N_0$ to $N_{15}$ which is equal to the value delivered by the circuit 4 exceeds the upper threshold Rh (said signal being defined during the first sequence s2 of the same time interval I); and (5) by the level "1" or "0" of L3 which varies at the beginning of the second half of each period of the clock signal H to indicate whether the count concerning the value $N_{j-1}$ exceeds the lower threshold Rb.

The count increment defining circuit 510 delivers in response to these signals the value of increment to be applied to the corresponding count in accordance with the above Table II.

The updated count concerning the value $N_{j-1}$ is then available at the output from the summing circuit 511 and is written into the memory 550 during the write operation which takes place on the rising fronts of the clock signal H marking the end of said j-th period. Thus, in the presence of a selected value N at the output from the circuit 4 over the interval I under consideration, and provided the count concerned by said selected value N (i.e. the count relating to the discrete value which is equal to the selected value N) does not exceed the upper threshold Rh (Rh=247), the count is increased by four units, or alternatively by five units if said value N is equal to the value present on the ouput 3 from the circuit as a whole during the first sequence s2 of the interval I under consideration which, in practice, can only happen during the setting up period of the circuit, while none of the other counts is modified. In contrast, if the count relating to the selected value N exceeds the upper threshold Rh, this count remains unchanged while all the other counts which are above the lower threshold Rb (Rb=7) are decreased by four or five units depending on whether the selected value N is not or is equal to the value present at the output 3 of the circuit as a whole during the first sequence s2 of the interval I under consideration. Any counts which were not greater than the lower threshold Rb are not modified. If no selected value N is present at the output from the circuit 4 during the interval I under consideration, none of the counts is modified.

Since the code stored in the register 520 after the sequence s2 has taken place is sampled by the register 521 at the end of the first clock period of the second sequence s2, and since the clock enable signal C2 is at level "1" this is the code which is delivered at the output of the circuit as a whole to define the new value of the evaluated noise level NB.

Since the absolute value of the count increment is five or four depending on whether the selected value N is equal to or is not equal to the currently evaluated noise level NB, it will be observed that weighting is applied to ensure hysteresis which avoids hunting.

Figure 4:
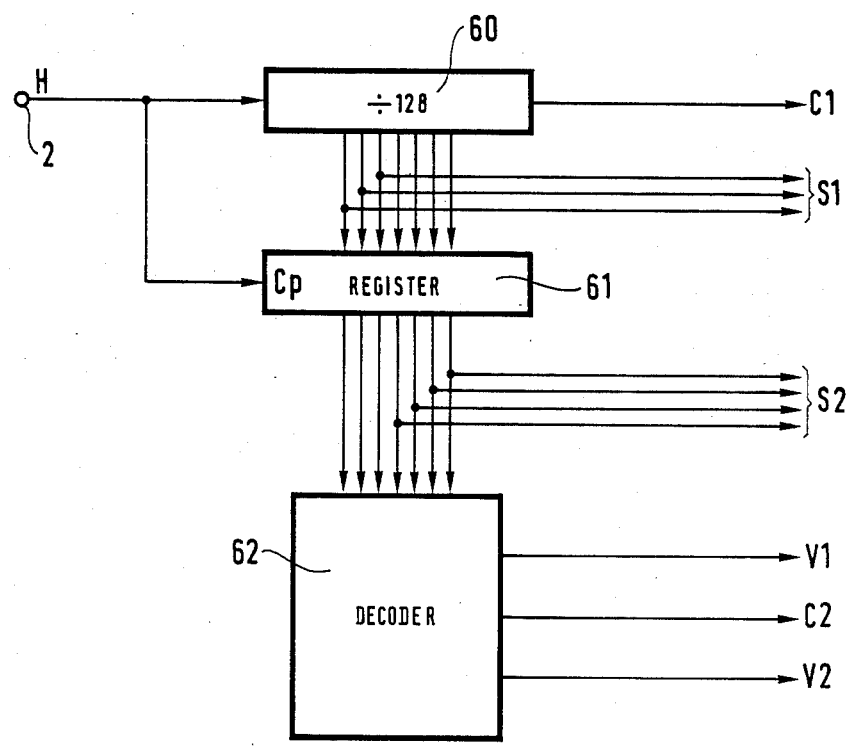
FIG. 4 is a block diagram of a clock circuit used in the FIG. 1 circuit.

FIG. 4 is a more detailed block diagram of the clock circuit 6 shown in FIG. 1 for taking the clock signal H and for generating therefrom the various signals C1 and S1 as applied to the circuit 4 for evaluating and selecting the level values of the signal present on the channel and C2, V1, V2 and S2 as applied to the circuit 5 for analysing the selected values.

The clock circuit 6 is described in the context of the numeric example given above, in particular with reference to FIGS. 2 and 3. In comprises a counter 60 which receives the clock signal H and its input, a register 61 which receives the successive states of the counter 60 and delays them by one clock period, and a decoder 62 receiving the successive states of the counter 60 as delayed by the register 61.

The counter 60 is a divide by 128 circuit. At its output it delivers states 0 to 127 defined on seven bits at the sampling frequency and for a duration equal to each time interval I, i.e. 16 ms. The clock signal C1 is generated during the "1" level during the 0 state output therefrom and the level "0" during all the other states, thereby defining the intervals of the successive periods I. The signal C1 which is illustrated as being delivered on an independent output from the counter could alternatively be obtained from the output of a logical NOR gate having its inputs connected to receive the successive states taken by the counter. The counter also generates the sequence signal S1 which defines the sequence s1 for each time interval I by dividing each time interval I into eight equal sub-intervals for changing the abolute value of the variation step p of the comparison value n. The sequence signal S1 is defined by the three most significant bits of the successive states of the counter and each sequence s1 is thus constituted by a sequence of eight numbers, running from 0 to 7 and cycling regularly throughout the time interval I under consideration.

The register 61 receives the seven bits defining the successive states taken by the counter and also receives the clock signal H on its clock input Cp to generate at its output the sequence signal S2 which defines the sequences s2 during each time interval I. The sequence signal S2 is defined by the four least significant bits of the states of the counter and as delivered after a delay of one period of the clock signal from the output of the register. It thus defines eight sequences s2 for each time interval I, with the first sequence starting with the indicated delay, i.e. on the second sampling period of the time interval I under consideration. Each of these sequences is constituted by the sequence of numbers 0 to 15 counting at the sampling frequency.

The decoder 62 receives the seven bits defining the successive states of the counter after the delay which is introduced by the register 61. It is arranged to deliver the signal V1 which has level "1" for the states 0 to 15 of the counter 60 which it receives from the register 61 and level "0" for the other states thereof, and the signal V2 which has level "1" for the states 16 to 31 which it receives and the level "0" for the other states it receives. These two signals V1 and V2 thus respectively select the first and the second sequences s2 contained in the above-mentioned sequence signal S2. The decoder 62 is also arranged to deliver the clock signal C2 which has the level "1" for state 16 of the counter 60 as received from the register 61 and the level "0" for all other states thereof, i.e. a signal of the same duration as the signal C1, but beginning with the second sequence s2 or after a delay relative to the signal C1 of seventeen periods of the clock signal. The decoder 62 may likewise be constituted by means of a PROM.

Figure 5:
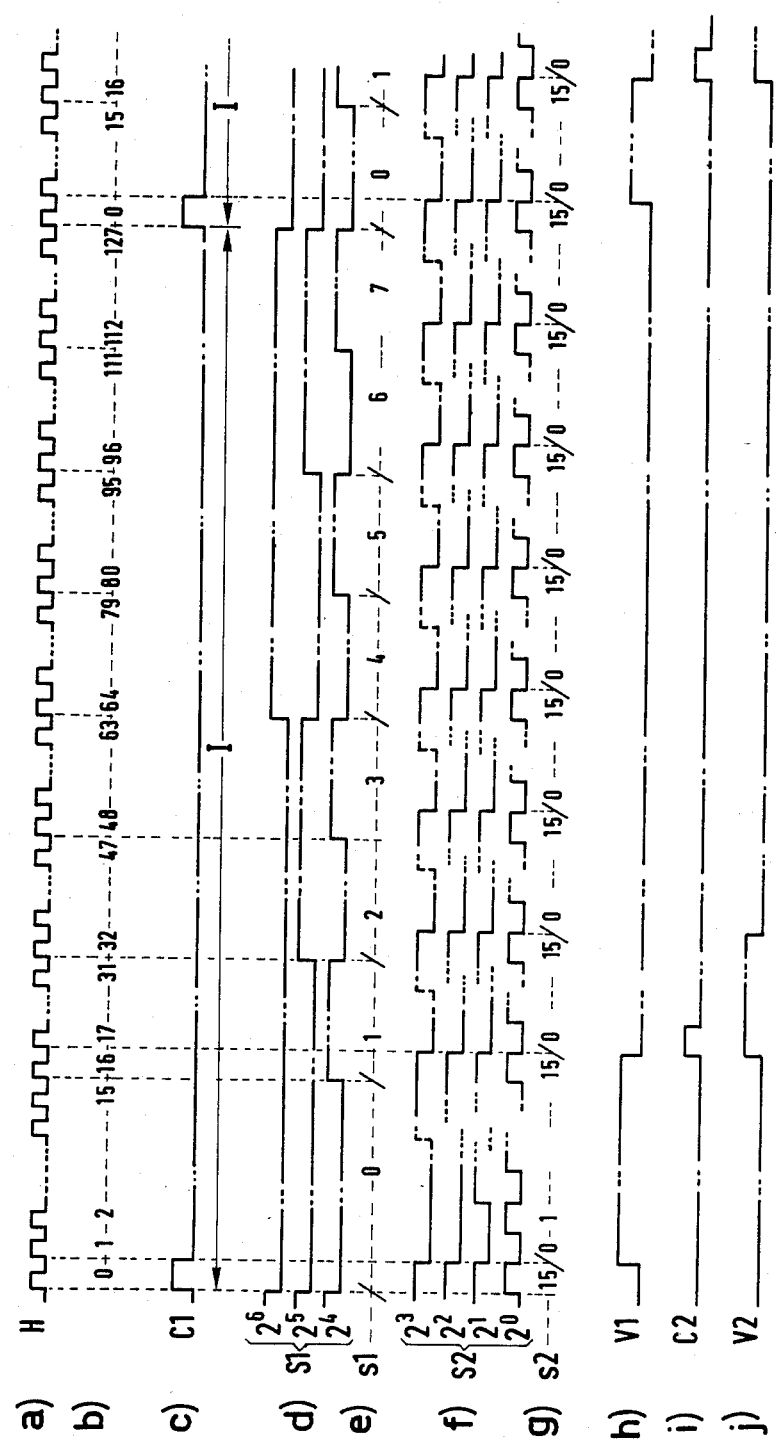
FIG. 5 is a waveform diagram showing the timing of various signals delivered by the FIG. 4 clock circuit.

FIG. 5 shows the waveforms of the various signals delivered by the clock circuit shown in FIG. 4 as applied to the rest of the circuit as explained above with reference to FIGS. 1 to 4. In FIG. 5:

waveform (a) shows the clock signal H defining the sampling rate for the signal present on the telephone channel;

waveform (b) shows the successive states taken by the counter 60 is decimal notation, these states cycle from 0 to 127 at the frequency of the signal H;

waveform (c) shows the clock signal C1 obtained from the counter 60, said signal C1 being at level "1" only for the state 0 of the counter, thus defining successive time intervals I during each of which one level evaluation will take place of the signal on the channel;

waveform (d) shows the sequence signal S1 defined by the three most significant bits noted $2^4$, $2^5$ and $2^6$ of the successive states of the counter 60, and waveform (e) shows the sequence s1 which takes place during each time interval I and which takes the values marked in decimal notation of 0 to 7 as defined by the three bits of the signal S1 and which thus divides the time interval under consideration into eight sub-intervals for proper operation of the circuit 4 for evaluating and selecting the values of the level of the signal present on the channel (see FIGS. 1 and 2);

waveform (f) shows the sequence signal s2 as defined by the four least significant bits noted $2^0$ to $2^3$ of the successive states of the counter which are transmitted after a delay of one period of the clock signal H and consequently waveform (g) shows the repeating sequences s2 of which there are eight and which take place with a shift of one period of the clock signal H during each time interval I, running at the frequency of the clock signal H through the values 0 to 15 and shown in decimal notation on the figure; and waveform (h) shows the signal V1 for selecting the first sequence s2 during each time interval I, waveform (i) shows the clock signal C2 which is at level "1" during state 16 of the counter 60 as transmitted after a delay of one period of the clock signal H and waveform (j) shows the signal V2 for selecting the second sequence s2 during each time interval I; these signals V1, V2 and C2 being applied to control the circuit 5 for calculating the value of the noise level NB.

Furthermore, in addition to the above description it can be mentioned that the noise level present during short intersyllabic pauses (each of which lasts for about 50 ms and which together represent about 20% of the time during continuous speech) also contributes to the evaluation of the noise level. This gives rise to a short acquisition period which varies between 1 and 4 or 5 seconds in the worked example given above, even when the channel being processed in conveying echo signals in addition to useful speech signals.

With reference to the embodiment described above, it is possible, without going beyond the scope of the invention to modify certain arrangements and/or to replace various means by equivalent means.

In particular, it is to be understood that the level of the signal present on the telephone channel could be evaluated within the range of noise levels (P) directly as a function of the discrete values ($N_0$ to $N_{r-1}$) which are defined in said range for evaluating the noise level, in which case there would be no need to perform the transcoding operation in the selector circuit (41) as described above. Further, it is obvious that analog circuits could be used to evaluate the level of signal present on the telephone channel, particularly if said signal was available in analog form on said channel.

I claim:

1. A method of evaluating a noise level on a telephone channel on the basis of a signal present on the channel during successive time intervals of substantially equal duration, the method comprising the steps of:

assigning the noise level on said channel to a given "noise level" range made up of a limited defined set of discrete level values;

observing successive signal level values present on the channel and selecting those observed values which lie in said noise level range; and keeping records of different selected signal level values expressed in terms of said discrete values to take as being representative of the noise level on the channel that one of the discrete values on which the majority of the selected signal level values are concentrated.

2. A method of evaluating noise level according to claim 1, wherein the level of the signal present on the telephone channel is evaluated by comparing amplitudes of successive samples of the signal present on a channel which is sampled at a sampling rate with a comparison level value, the method further comprising, for the evaluation of the signal level present on the telephone channel:

splitting each time interval I into defined subintervals;

generating a comparison level value during each time interval I by accumulating a variation step of the comparison level value at the sampling rate, said step having a sign defined in response to the comparison then performed and having an absolute value which is a function of a current time subinterval of the time interval under consideration; and taking the comparison level value at the end of each time interval I as the value of the signal level present on the channel.

3. A method of evaluating the noise level according to claim 2 wherein the absolute value of the steps in each time interval I follows a predetermined decreasing law.

4. A method of evaluating noise level according to claim 2, wherein the absolute value of the step at each interval is also a funcion of the absolute value of the difference between the amplitude of the sample and the value of the level as compared with one another.

5. A method of evaluating noise level according to claim 4, wherein the absolute value of the step is defined during each time interval I by the absolute value of the difference between the amplitude of the sample and the value of the level as compared with one another and as weighted by a proportionality coefficient which decreases throughout the duration of the time interval under consideration.

6. A method of evaluating noise level according to claim 2, wherein said accumulation of variation steps in the value of the comparison level is limited between a lower stop value and an upper stop value which are fixed and which define a range of levels including said range of noise levels and extending beyond said range, at least at its upper end.

7. A method of evaluating noise level according to claim 1, wherein a count relating to said selected values as expressed in terms of said discrete values is performed by maintaining a count for each of said discrete values and by modifying said count by an increment:

of positive value each time the selected value corresponds to the discrete value being processed and the count associated with said discrete value being processed is not greater than a predetermined upper threshold; and by a negative amount whenever the selected value corresponds to a discrete value other than the discrete value being processed, the count associated with the selected value exceeds said upper threshold, and the count associated with the discrete value being processed is greater than a predetermined lower threshold.

8. A method of evaluating noise level according to claim 1, wherein each selected value used in keeping the records associated with the selected values is weighted by a greater or lesser amount depending on whether or not the selected value is equal to a currently evaluated noise level.

9. Apparatus for performing the method of evaluating noise level according to claim 1, the apparatus comprising an evaluator circuit for evaluating the level of the signal present on the telephone channel during successive time intervals I of substantially equal duration;
   a selector circuit connected to receive successive evaluated signal levels from the evaluator circuit and for selecting only those evaluated levels which lie within a given "noise level" range of values assigned to noise, said selected values being delivered expressed in terms of a limited defined set of r discrete level values;
   an analyser circuit connected to receive said selected values as delivered by said selector circuit, said analyser circuit being sensitive to a distribution of said selected values amongst said discrete values for determining that one of the discrete values on which the majority of the selected values are concentrated and for delivering said determined value at an output to represent the noise level; and
   a clock circuit for driving said evaluator circuit, said selector circuit, and said analyser circuit to determine the noise level once every time interval I as determined by said clock circuit.

10. Apparatus according to claim 9, wherein said evaluator circuit for evaluating the signal level present on the channel comprises a comparator for comparing amplitudes of signal samples taken from the channel at a regular sampling rate against a comparison level, wherein said evaluator circuit is constituted by a servo loop which includes:
    said comparator which delivers a logical signal indicating whether the amplitude of the sample being compared to the compression level value is greater than said value or not;
    a circuit for defining variation in the level of the comparison value, said circuit receiving a logical comparison signal together with a first sequence signal generated by the clock circuit and defining a series of identical sequences which take place during successive respective time intervals I, and delivering a variation step of sign defined by said logical signal and of variable absolute value defined under control of said first sequence signal; and
    an accumulator connected to an output from the circuit for defining the variation in the comparison level and operating at the sampling frequency of the signal present on the channel to deliver the value of said comparison level which defines the value of the signal level present on the channel at the end of each time interval I.

11. Apparatus according to claim 10, wherein said accumulator has a lower stop and an upper stop defining a range of possible variations for said comparison level and including said noise level range, the comparison level range extending beyond at least the upper end of said noise level range.

12. Apparatus according to claim 9, wherein said analyser circuit for analysing the selected values comprises:
    an addressable memory addressed under control of a second sequence signal generated by said clock circuit, said memory storing r counts each corresponding to a respective one of said r discrete values and together being representative of a distribution of said selected values delivered by said selector circuit from amongst the r possible discrete values;
    a count computing circuit comprising firstly a count increment defining circuit for defining a count increment and secondly a two-input summing circuit having one input connected to an output from said memory, having the other input connected to an output from said count increment defining circuit, and having an output connected to an input to said memory;
    a control circuit including comparator means, said control circuit being arranged, on arrival of each selected value as delivered by the selector circuit, firstly to compare each particular selected value with r possible discrete values to identify a corresponding memory address, secondly to compare each of the stored counts with a predetermined lower threshold value and a predetermined upper threshold value, and thirdly to control said count increment defining circuit to choose a positive increment value for the selected discrete value only whenever the count corresponding to the selected discrete value selected by the selector circuit does not exceed said upper threshold value, and to choose a negative increment value for all other counts greater than said lower threshold value whenever the count corresponding to the selected discrete value exceeds said upper threshold; and
    a noise level value output circuit controlled by said control circuit when a memorised count exceeds said upper threshold value to output the discrete value corresponding to said count.

13. Apparatus according to claim 12, wherein the second sequence signal generated by the clock circuit defines during each time interval I at least two sequences, each of which runs through r values representative of each of the said r discrete values, said sequences defined by said second sequence signal being used during each time interval I for which the selector circuit delivers a selected value as follows;
    a first of said sequences within the time interval is used by said control circuit to determine the position of the count corresponding to the selected value relative to said upper threshold; and
    a second of said sequence which takes place after said first of said sequences is used to update the counts in the memory as a function of the comparison performed during said first sequence and, where appropriate, of positions of other counts relative to said lower threshold as compared during said second sequence for each of the counts needing updating.

14. Apparatus according to claim 12, wherein said control circuit is connected to an output of the apparatus as a whole and further comprises a comparator for comparing each selected value as delivered by the selection circuit with the value of the noise level currently being delivered at the output from the apparatus, said comparison being used by the count increment defining circuit to select a count increment whose absolute value is greater if the selected value is equal to the current evaluated value of the noise level, and is smaller otherwise.

15. Apparatus according to claim 14, wherein the second sequence signal generated by the clock circuit defines during each time interval I at least two sequences, each of which runs through r values representative of each of the said r discrete values, said sequences defined by said second sequence signal being used during each time interval I for which the selector circuit delivers a selected value as follows;

a first of said sequences within the time interval is used by said control circuit to determine the position of the count corresponding to the selected value relative to said upper threshold, and to determine in said control circuit whether said selected value is equal or not to the noise level value delivered at the output from the apparatus; and a second of said sequences which takes place after said first of said sequences is used to update the counts in the memory as a function of the comparison performed during said first sequence and, where appropriate, of positions of other counts relative to said lower threshold as compared during said second sequence for each of the counts needing updating.

* * * * *